(12) United States Patent
Yasukawa (10) Patent No.: US 7,192,812 B2
(45) Date of Patent: Mar. 20, 2007

(54) METHOD FOR MANUFACTURING ELECTRO-OPTICAL SUBSTRATE

(75) Inventor: Masahiro Yasukawa, Chino (JP)

(73) Assignee: Seiko Epson Corporation, Tokyo (JP)

( * ) Notice: Subject to any disclaimer, the term of this patent is extended or adjusted under 35 U.S.C. 154(b) by 100 days.

(21) Appl. No.: 10/734,246

(22) Filed: Dec. 15, 2003

(65) Prior Publication Data

US 2004/0140515 A1 Jul. 22, 2004

(30) Foreign Application Priority Data

Dec. 20, 2002 (JP) ............................. 2002-369951

(51) Int. Cl.
*H01L 21/00* (2006.01)

(52) U.S. Cl. .................. 438/149; 438/455; 438/311

(58) Field of Classification Search ............... 438/149, 438/311, 455; 349/42
See application file for complete search history.

(56) References Cited

U.S. PATENT DOCUMENTS

| 5,614,730 | A | * | 3/1997 | Nakazawa et al. ............ 257/59 |
| 6,297,862 | B1 | | 10/2001 | Murade |
| 6,388,721 | B1 | * | 5/2002 | Murade ..................... 349/44 |
| 6,493,046 | B1 | | 12/2002 | Ueda |
| 6,608,658 | B1 | | 8/2003 | Tsujimura et al. |
| 6,740,938 | B2 | * | 5/2004 | Tsunoda et al. ............ 257/365 |
| 2002/0052057 | A1 | | 5/2002 | Wong |

FOREIGN PATENT DOCUMENTS

| CN | 1205087 A | 1/1999 |
| JP | A 4-133033 | 5/1992 |
| JP | A 10-293320 | 11/1998 |
| JP | A 2001-196589 | 7/2001 |
| JP | A 2003-172950 | 6/2003 |
| KR | 2001-0015071 | 2/2001 |
| TW | 499605 | 8/2002 |

* cited by examiner

*Primary Examiner*—Thanh Nguyen
(74) *Attorney, Agent, or Firm*—Oliff & Berridge, PLC (57) ABSTRACT

To provide a method for manufacturing an electro-optical substrate having high reliability with high yield. The method for manufacturing an electro-optical substrate including a composite base plate obtained by joining a support plate to a semiconductor plate having single-crystal silicon precursor layer (semiconductor precursor layer) can include a step of forming a light-shielding layer, having a predetermined pattern, on the support plate, a step of forming an insulating layer on the light-shielding layer having the predetermined pattern, a step of providing semiconductor layers on the insulating layer, a step of oxidizing parts of the semiconductor layers to form oxide layers, and a step of removing the oxide layers. The oxide layers can have a thickness smaller than that of the insulating layer.

7 Claims, 8 Drawing Sheets

METHOD FOR MANUFACTURING ELECTRO-OPTICAL SUBSTRATE

BACKGROUND OF THE INVENTION

1. Field of Invention

The present invention relates to a method for manufacturing an electro-optical substrate using a silicon-on-insulator technique (hereinafter referred to as an SOI technique), a method for manufacturing an electro-optical apparatus, and an electro-optical apparatus.

2. Description of Related Art

In active matrix driving of electro-optical apparatuses including thin-film transistors (TFTs), when light is applied to channel regions of the TFTs, each connected to corresponding pixels, for switching the pixels, photo-leakage current is generated due to photoexcitation in some cases, thereby changing properties of the TFTs. In particular, for an electro-optical apparatus for light valves used for projectors, since incident light has high intensity, it is critical to shield the channel regions of the TFTs and neighboring regions from the incident light. Therefore, in known electro-optical apparatuses, the channel regions and neighboring regions are shielded from light using a light-shielding film having openings corresponding to pixels arranged on a counter substrate or using data lines containing metal such as aluminum (Al) and extending above TFTs of a TFT array substrate.

Another light-shielding film containing, for example, a high melting metal is placed below the TFTs of the TFT array substrate in some cases. The light-shielding film placed below the TFTs prevents the following light from entering the TFTs of the electro-optical apparatus: light reflected by the TFT array substrate and returning light, such as projected light, transmitted through a prism placed in an optical system including a plurality of electro-optical devices combined with the prism placed among the electro-optical devices, the returning light being transmitted from other electro-optical devices. See, for example, Japanese Unexamined Patent Application Publication No. 4-133033.

SUMMARY OF THE INVENTION

Known methods for manufacturing such TFTs include the SOI technique. The SOI technique is used for manufacturing electro-optical devices because the following advantages can be achieved: elements operating at high speed can be obtained, electric consumption can be reduced, and the elements can be densely integrated. For example, a support substrate having a light-shielding layer and an insulating layer thereon is joined to a device-forming film including single-crystal semiconductor layers containing single-crystal silicon, and the resulting film is then polished, whereby single-crystal semiconductor thin-films are formed. The single-crystal semiconductor thin-films are used for forming, for example, TFTs for driving liquid crystals.

When the single-crystal semiconductor thin-films are used for forming transistor elements, such as TFTs for driving liquid crystals, the thickness of the single-crystal semiconductor thin-films which form transistor elements is controlled by wet-etching the single-crystal semiconductor thin-films that have been patterned or by wet-etching oxide layers obtained by oxidizing the single-crystal semiconductor thin-films. However, in a step of controlling the thickness of the single-crystal semiconductor thin-films, when the oxide layers are wet-etched, regions of the interface between the joined substrate and film and portions of the insulating layer are etched and the light-shielding layer disposed below the insulating layer is also etched in some cases, wherein the regions and portions have no single-crystal semiconductor thin-films thereon. Therefore, there is a problem in that sufficient light-shielding properties cannot be obtained.

The present invention has been made in order to solve at least the above problem. It is an object of the present invention to provide a method for manufacturing an electro-optical substrate having high reliability with high yield, wherein the electro-optical substrate has a light-shielding layer formed thereon using the SOI technique. In particular, it is an object of the present invention can be to provide a method for manufacturing such an electro-optical substrate having high optical resistance due to the light-shielding layer, which is hardly etched in manufacturing steps. It is another object of the present invention to provide a method for manufacturing an electro-optical apparatus including the electro-optical substrate. It is another object of the present invention to provide an electro-optical apparatus, manufactured by the manufacturing method, having high reliability.

In order to solve the above problem, a method for manufacturing an electro-optical substrate including a composite base plate obtained by joining a support plate to a semiconductor plate having semiconductor layers includes a step of forming a light-shielding layer, having a predetermined pattern, on a support plate, a step of forming an insulating layer on the light-shielding layer having the predetermined pattern, a step of providing semiconductor layers having a predetermined pattern on the insulating layer, a step of oxidizing parts of the semiconductor layers to form oxide layers, and a step of removing the oxide layers. The oxide layers have a thickness smaller than that of the insulating layer.

According to the above manufacturing method, in order to adjust the thickness of the semiconductor layers, parts of the semiconductor layers are oxidized and the obtained oxide layers are then removed. In this procedure, the oxide layers (hereinafter referred to as sacrificial oxide layers) obtained by oxidizing parts of the semiconductor layers have a thickness smaller than that of the insulating layer. Therefore, in the step of removing the oxide layers, the insulating layer disposed in areas above which the semiconductor layers are not placed can be prevented from being entirely etched (or removed) even if a part of the insulating layer is etched. At least the light-shielding layer can be prevented from being etched, thereby securely maintaining properties of the light-shielding layer. Thus, the electro-optical substrate having no defects but having high reliability can be manufactured with high yield. In particular, when the oxide layers have a thickness smaller than that of parts of the insulating layer disposed in areas above which the semiconductor layers are not placed and which are disposed on the light-shielding layer, problems such as the erosion of the light-shielding layer can be securely prevented from occurring in the step of removing the oxide layers.

The manufacturing method may further include a step of patterning the semiconductor layers and a step of oxidizing parts of the semiconductor layers having a predetermined pattern to form the oxide layers. The patterning step and oxidizing step are performed after the semiconductor layer-providing step.

The manufacturing method may further include a step of oxidizing parts of the semiconductor layers to form gate oxide layers. The semiconductor layer-oxidizing step is performed after the oxide layer-removing step.

The manufacturing method may further include a step of forming a silicon nitride layer or silicon oxide nitride layer between the light-shielding layer and the insulating layer. This step is performed after the insulating layer-forming step. Since the silicon nitride layer or silicon oxide nitride layer has dense structure, oxidative substances such as oxygen and moisture can be securely prevented from permeating the silicon nitride layer or silicon oxide layer. That is, since the oxidative substances such as oxygen and moisture hardly permeate the dense silicon nitride layer or silicon oxide layer, the light-shielding layer can be prevented from being oxidized, thereby enhancing the light-shielding properties. In the present invention, the insulating layer disposed on the silicon nitride layer or silicon oxide layer disposed on the light-shielding layer has a thickness larger than that of the sacrificial oxide layers. Thus, problems, such as the erosion of the silicon nitride layer or silicon oxide layer, can be prevented from occurring, thereby securely marinating the light-shielding properties. When the silicon nitride layer or silicon oxide nitride layer has a large thickness, there is a problem in that the layer has a color. However, the silicon nitride layer or silicon oxide nitride layer may have a small thickness because the layer is not etched in the manufacturing steps. Thus, the problem of colorization can be avoided.

In the manufacturing method, the semiconductor layer-providing step may include a sub-step of joining a single-crystal semiconductor plate including the semiconductor layers to a support plate including the insulating layer. Thereby, a composite base plate including the support plate and semiconductor plate joined to each other can be obtained. Hence the semiconductor layers used in the present invention can be readily formed. The support plate used in the present invention preferably includes mainly a transparent insulating wafer, for example, a quartz wafer.

In the present invention, the light-shielding layer has a predetermined pattern and may have a plane pattern such as a grid pattern, striped pattern, or dotted pattern. The lower faces of the semiconductor layers (for example, channel regions) can be shielded from light using the light-shielding layer. The light-shielding layer may contain a high-melting metal or a silicide containing a high-melting metal, whereby the electro-optical substrate has a satisfactory light-shielding function. Such a high-melting metal includes, for example, titanium (Ti), chromium (Cr), tungsten (W), tantalum (Ta), molybdenum (Mo), and lead (Pb). The light-shielding layer may include sub-layers containing any one of the above metals, an alloy, silicide, or polysilicide containing such a metal.

The insulating layer disposed on the light-shielding layer preferably contains silicon dioxide as a main component and may have, for example, multilayer structure.

The insulating layer may entirely cover the light-shielding layer, that is, the insulating layer may be disposed substantially over the support plate. The insulating layer has an area larger than that of the light-shielding layer and has a plane pattern such as a grid pattern, striped pattern, or dotted pattern. The edge of the insulating layer is located outside the edge of the light-shielding layer when viewed from above. In order to enhance the adhesion between the light-shielding layer and the silicon nitride layer or silicon oxide nitride layer, a silicon dioxide layer may be placed therebetween.

In the present invention, a method for manufacturing an electro-optical apparatus including semiconductor elements includes a step of manufacturing an electro-optical substrate including the semiconductor elements by the electro-optical substrate-manufacturing method. That is, since the electro-optical substrate, which is one of semiconductor substrates including semiconductor elements for switching and driving electro-optical apparatuses, is manufactured by the above method, a semiconductor substrate having satisfactory light-shielding properties and high reliability can be obtained.

In the present invention, an electro-optical apparatus including a substrate and semiconductor elements disposed thereon can include a light-shielding layer, disposed on the substrate, having a predetermined pattern, an insulating layer disposed on the light-shielding layer, and semiconductor layers, disposed on the insulating layer, having a predetermined pattern. The insulating layer, disposed between the light-shielding layer and semiconductor layers, lying in a display region has a thickness of 0.4 μm or more.

The electro-optical substrate has a display region for displaying an image and other regions such as non-display regions. When peripheral driving circuits are placed in the non-display regions disposed on the substrate, semiconductor layers of the semiconductor elements must have a thickness of 0.2 μm or more because a voltage of about 12 V is necessary to drive the semiconductor elements arranged in the non-display regions. On the other hand, in order to form the semiconductor elements in the non-display regions, the semiconductor layers of the semiconductor elements arranged in the display region must have a thickness of 0.07 μm or less. When the display region and non-display regions are formed in one step, the semiconductor layers arranged in the display region and non-display regions must have a thickness of 0.2 μm or more. In order to reduce the thickness of the semiconductor layers of the semiconductor elements arranged in the display region from 0.2 μm or more to 0.07 μm, 0.13 μm or more of the semiconductor layers must be removed. When the sacrificial oxide layers described above are formed and then removed in order to reduce the thickness, the sacrificial oxide layers must have a thickness of about 0.3 μm in consideration of the volume expansion due to oxidation. Thus, the insulating layer disposed below the semiconductor layers must have a thickness larger than that of the sacrificial oxide layers, for example, a thickness of at least 0.4 μm in consideration of a margin reduced by the chemical polishing of the layer, as described in the above electro-optical substrate-manufacturing method. That is, when the insulating layer has a thickness of about 0.4 μm, the following problem can be prevented: the light-shielding layer and the like disposed below the insulating layer are peeled off because the insulating layer is etched in manufacturing steps. Thus, the electro-optical apparatus having high reliability can be obtained.

BRIEF DESCRIPTION OF THE DRAWINGS

The invention will be described with reference to the accompanying drawings, wherein like numerals reference like elements, and wherein.

DETAILED DESCRIPTION OF PREFERRED EMBODIMENTS

Embodiments of the present invention will now be described in detail with reference to the accompanying drawings. In the drawings described below, in order to provide a clear understanding of the drawings, different scales are used for showing members.

Figure 1:
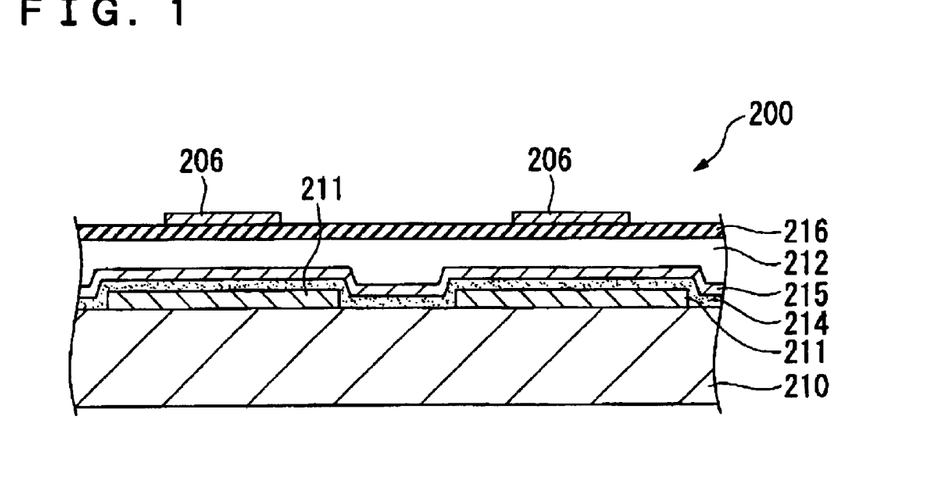
FIG. 1 is a sectional view showing a configuration of an electro-optical substrate obtained by a manufacturing method according to the present invention.

A configuration of an electro-optical substrate manufactured by a method of the present invention will now be described. FIG. 1 is a sectional view showing an exemplary configuration of such an electro-optical substrate according to the present invention. The electro-optical substrate 200 shown in FIG. 1 includes a support plate 210, a light-shielding layer 211, disposed on the support plate 210, having a predetermined pattern, an adhesion layer 214, disposed over the light-shielding layer 211, containing silicon dioxide, a protective layer 215, disposed on the adhesion layer 214, containing silicon nitride or silicon oxide nitride, an insulating layer 212 disposed on the protective layer 215, and single-crystal silicon layers (semiconductor layers) 206 disposed on the insulating layer 212 via a bonding insulating layer 216. In this configuration, various switching elements, such as transistor elements, are to be formed on the single-crystal silicon layers 206 below which the light-shielding layer 211 is placed.

A method for manufacturing the electro-optical substrate 200 shown in FIG. 1 will now be described with reference to FIGS. 2 and 3. FIGS. 2 and 3 are sectional views showing steps of manufacturing the electro-optical substrate 200. FIGS. 2(a) to 2(d) and 3(a) to 3(c) are sectional views each showing the corresponding manufacturing steps. The manufacturing method described below is only an example, and the present invention is not limited to the manufacturing method.

Figure 2A:
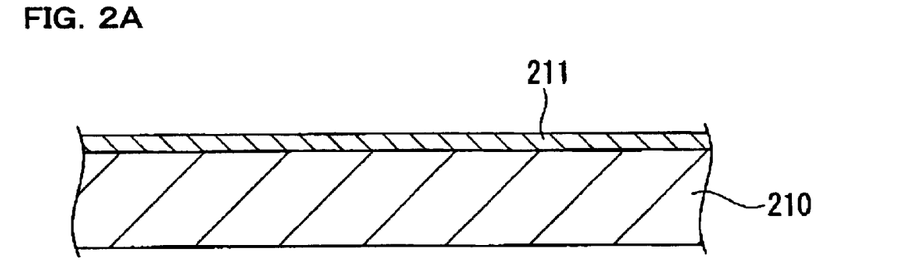
FIG. 2 is a sectional view showing steps of manufacturing the electro-optical substrate shown in FIG. 1.
Figure 3A:
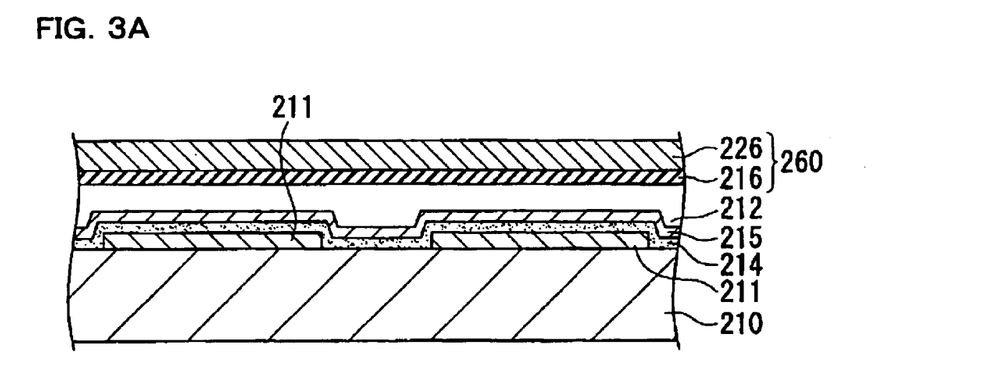
FIG. 3 is a sectional view showing steps of manufacturing the electro-optical substrate following the steps shown in FIG. 2.
Figure 3B:
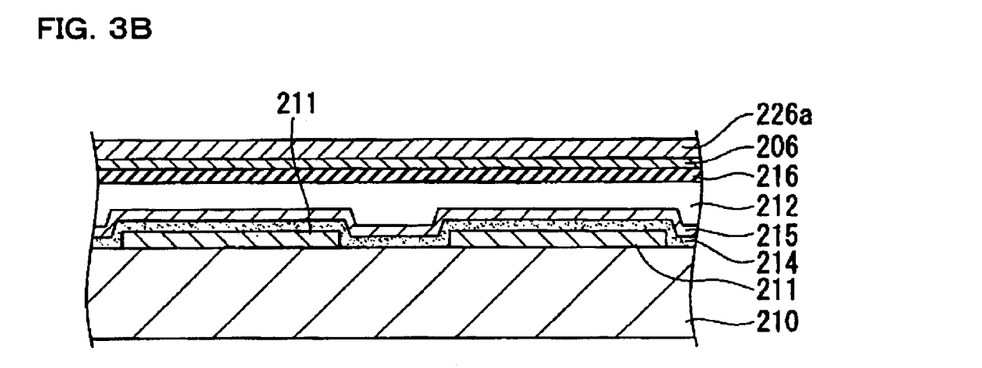
Figure 3C:
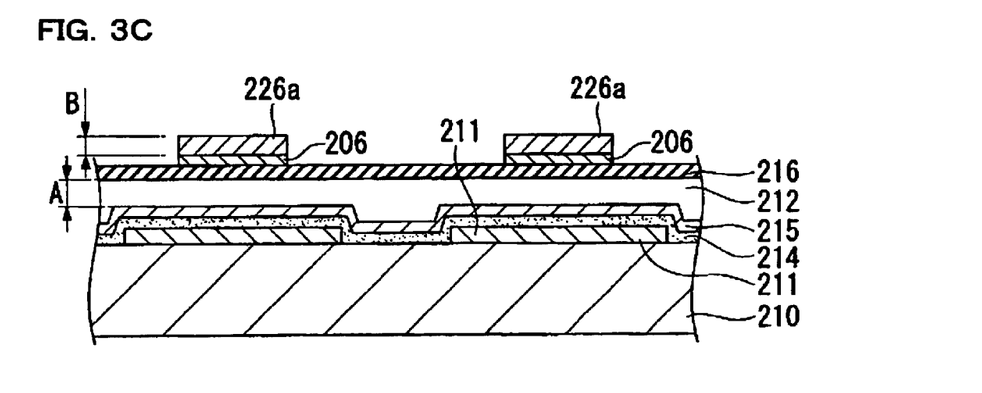

As shown in FIG. 2(a), the light-shielding layer 211 can be formed over the support plate 210. The support plate 210 is a quartz plate having a thickness of, for example, 1.2 mm. The light-shielding layer 211 is formed by depositing, for example, tungsten suicide to a thickness of 100–250 nm, more preferably 200 nm, by a sputtering process. It should be understood that a material for forming the light-shielding layer 211 is not limited to one described in this embodiment, and any material may be used as long as the material is stable at a maximum temperature for thermally processing devices to be formed. High melting metals, such as molybdenum and tantalum, polysilicon, and silicides, such as molybdenum silicide, may be used other than tungsten silicide. A process for forming the light-shielding layer 211 includes a CVD process, an electron beam source evaporation process, and the like other than the sputtering process.

Figure 2B:
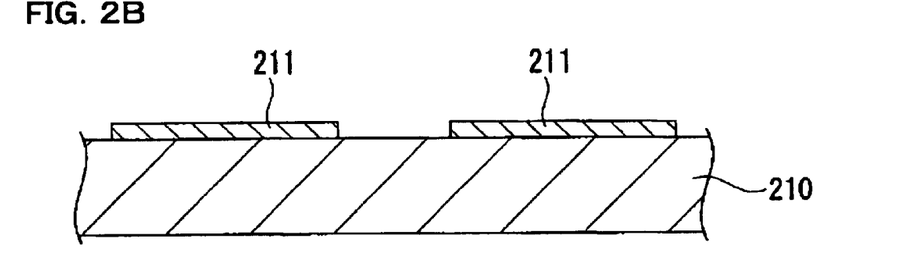

A photoresist is provided on the light-shielding layer 211 shown in FIG. 2(a) so as to form a predetermined pattern in plan view, the light-shielding layer 211 is etched using the photoresist as a mask, and the photoresist is then removed, thereby obtaining the support plate 210 including the light-shielding layer 211 having a predetermined pattern, as shown in FIG. 2(b). The photoresist is provided on regions on which no transistor elements are formed (regions around transistor elements) in addition to regions for forming such transistor elements in the same manner as the above. The regions on which no transistor elements are formed herein include a sealing region which is disposed around the transistor element-forming regions and on which a sealing member for bonding a counter substrate is placed, an area around a driving circuit for driving data lines and scanning lines, terminal pad regions for forming connection terminals for connecting input and output signal lines, and the like.

Figure 2C:
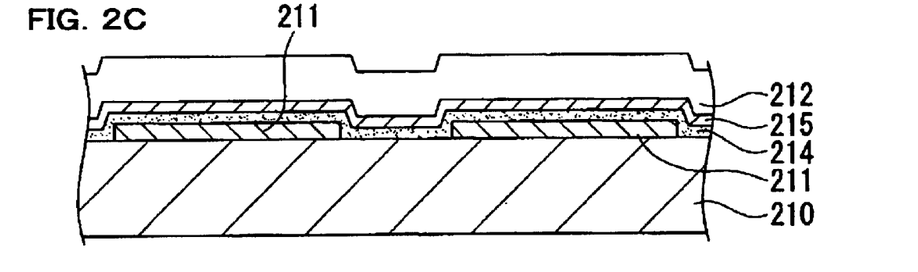

As shown in FIG. 2(c), the adhesion layer 214 containing, for example, silicon dioxide and the protective layer 215 containing any one of silicon nitride and silicon oxide nitride are formed over the patterned light-shielding layer 211 by, for example, a sputtering process. The insulating layer 212 containing silicon dioxide is formed on the protective layer 215. The silicon dioxide layers are deposited by a sputtering process or a plasma CVD process using TEOS (tetraethyl orthosilicate). A material for forming the insulating layer 212 includes, for example, nondoped silicate glass (NSG), phosphorus silicate glass (PSG), boron silicate glass (BSG), and boro-phospho-silicate glass (BPSG), which have high insulating properties, other than silicon dioxide.

Figure 2D:
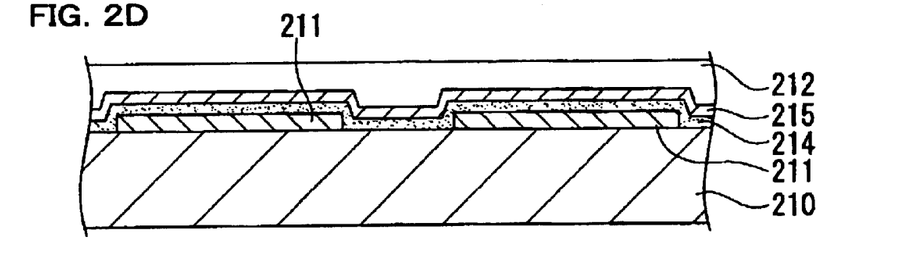

As shown in FIG. 2(d), the insulating layer 212 is planarized by globally polishing the surface thereof such that portions of the insulating layer 212 disposed above the light-shielding layer 211 have a predetermined thickness, for example, a thickness of about 0.4 μm. A polishing process for planarization includes, for example, a chemical mechanical polishing (CMP) process.

As shown in FIG. 3(a), the support plate 210, shown in FIG. 2(d), having the insulating layer 212 is bonded to a single-crystal silicon substrate (single-crystal semiconductor substrate) 260. The single-crystal silicon substrate 260 used for the bonding includes the bonding insulating layer 216 and a single-crystal silicon precursor layer 226 disposed thereon. The bonding insulating layer 216 is bonded to the insulating layer 212 of the support plate 210.

After the bonding operation, the thickness of the single-crystal silicon precursor layer 226 is adjusted. In this operation, as shown in FIG. 3(b), the single-crystal silicon precursor layer 226 is oxidized, thereby forming a sacrificial oxide layer 226a having a predetermined thickness. A photoresist is provided on the sacrificial oxide layer 226a so as to form a predetermined pattern in plan view, the single-crystal silicon precursor layer 226 and sacrificial oxide layer 226a are etched using the photoresist as a mask, and the photoresist is then removed, thereby obtaining layered structures consisting of pieces of the single-crystal silicon precursor layer 226 and pieces of the sacrificial oxide layer 226a. The layered structures are arranged in a predetermined pattern, as shown in FIG. 3(c). The pieces of the sacrificial oxide layer 226a are removed by a dry or wet etching process, thereby obtaining single-crystal silicon layers (semiconductor layers) 206 having a predetermined thickness. According to the above procedure, the electro-optical substrate 200 including the single-crystal silicon layers 206 shown in FIG. 1 is obtained.

Figure 9A:
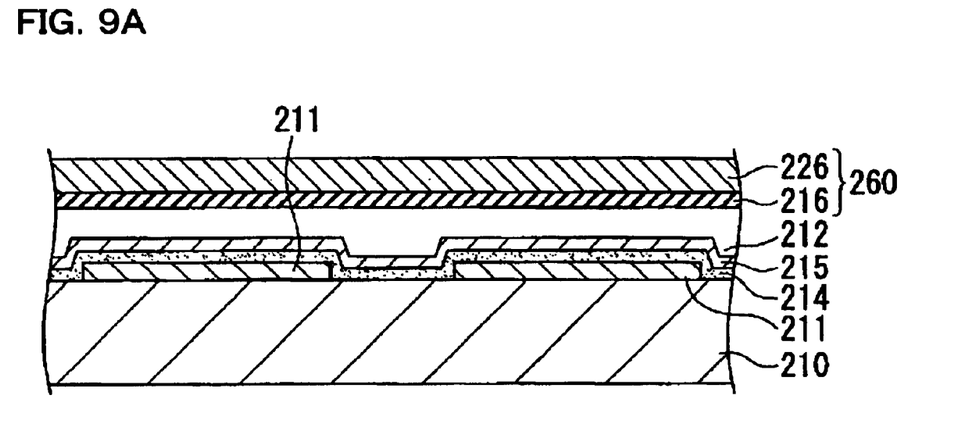
FIG. 9 is a sectional view showing another method for manufacturing the electro-optical substrate shown in FIG. 1.

The electro-optical substrate 200 including the single-crystal silicon layers 206 shown in FIG. 1 can be obtained by the method shown in FIG. 9. As shown in FIG. 9(a), the support plate 210, shown in FIG. 2(d), having the insulating layer 212 is bonded to the single-crystal silicon substrate (single-crystal semiconductor substrate) 260. The single-crystal silicon substrate 260 used for the bonding includes the bonding insulating layer 216 and the single-crystal silicon precursor layer 226 disposed thereon. The bonding insulating layer 216 is bonded to the insulating layer 212 of the support plate 210.

Figure 9B:
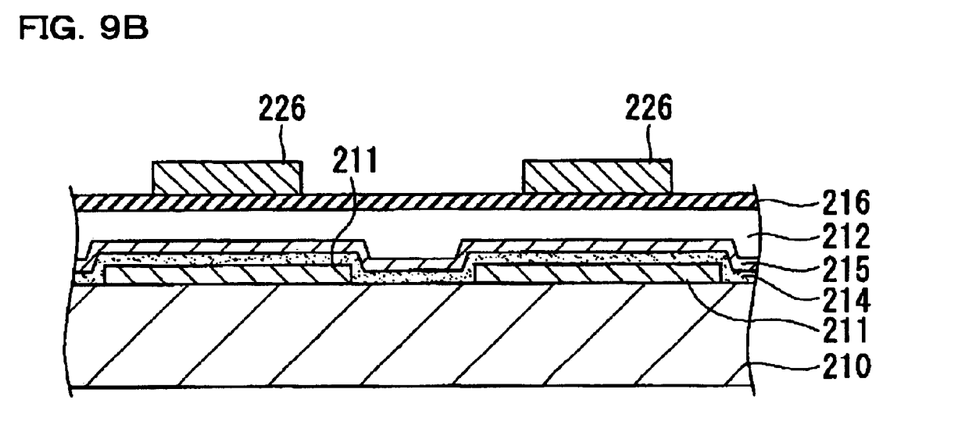
Figure 9C:
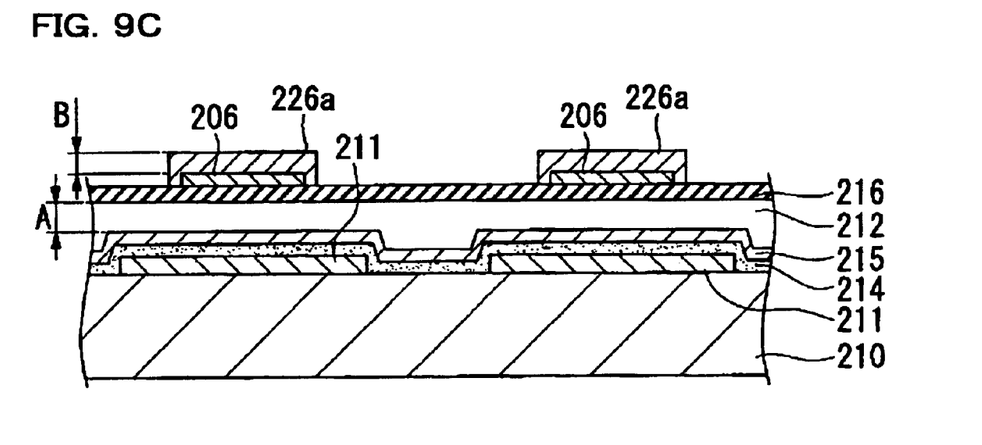

After the bonding operation, a photoresist is provided on the single-crystal silicon precursor layer 226 so as to form a predetermined pattern in plan view, the single-crystal silicon precursor layer 226 is etched using the photoresist as a mask, and the photoresist is then removed, thereby obtaining pieces of the single-crystal silicon precursor layer 226, the pieces being arranged in a predetermined pattern shown in FIG. 9(b). The thickness of the single-crystal silicon precursor layer 226 can then be adjusted. In this operation, as shown in FIG. 9(c), pieces of the single-crystal silicon precursor layer 226 are oxidized, thereby forming pieces of the sacrificial oxide layer 226a having a predetermined thickness. The pieces of the sacrificial oxide layer 226a are removed by a dry or wet etching process, thereby obtaining the single-crystal silicon layers (semiconductor layers) 206 having a predetermined thickness. According to the above procedure, the electro-optical substrate 200 including the single-crystal silicon layers 206 shown in FIG. 1 is obtained.

As described above, in the manufacturing method of this embodiment, in order to adjust the thickness of the patterned single-crystal silicon precursor layer 226 after the bonding operation, pieces of the single-crystal silicon precursor layer 226 are oxidized in the thickness direction, and oxidized portions are then removed. In the above operation, the sacrificial oxide layer 226a formed by oxidizing the single-crystal silicon precursor layer 226 have a thickness smaller than that of the insulating layer 212 of the support plate 210. In particular, as shown in FIGS. 3 and 9, the thickness B of the sacrificial oxide layer 226a is smaller than the thickness A of the insulating layer 212 disposed above the light-shielding layer 211. Therefore, if portions of the insulating layer 212 below regions in which the single-crystal silicon layers 206 are not placed are etched in the operation of removing the sacrificial oxide layers 226a (the etching operation), the following problems can be prevented from occurring: the protective layer 215 disposed between the light-shielding layer 211 and insulating layer 212 is peeled off and furthermore the light-shielding layer 211 is also peeled off. Thus, properties of the light-shielding layer 211 can be prevented from being deteriorated, whereby the electro-optical substrate 200 having no defect but high reliability can be manufactured with high yield.

Furthermore, since the protective layer 215, disposed between the light-shielding layer 211 and insulating layer 212, principally containing silicon nitride or silicon oxide nitride is not etched, the electro-optical substrate 200 has high reliability. Since the protective layer 215 containing silicon nitride or silicon oxide nitride has dense structure, oxidative substances, such as oxygen and moisture, hardly permeate the protective layer 215. Hence, the light-shielding layer 211 can be prevented from being oxidized because of the presence of the protective layer 215. Thus, properties of the light-shielding layer 211 can be prevented from being deteriorated. In this embodiment, since the thickness A of the insulating layer 212 disposed on the protective layer 215 is larger than the thickness B of the sacrificial oxide layer 226a, a problem that the protective layer 215 is etched can be prevented from occurring, thereby securely maintaining the light-shielding properties. Furthermore, when the protective layer 215 containing silicon nitride or silicon oxide nitride has a large thickness, there is a problem in that the protective layer 215 has a color. However, in this embodiment, the protective layer 215 may have a small thickness because the protective layer 215 is not etched in the manufacturing steps. Thus, the problem of colorization can be avoided.

Figure 4:
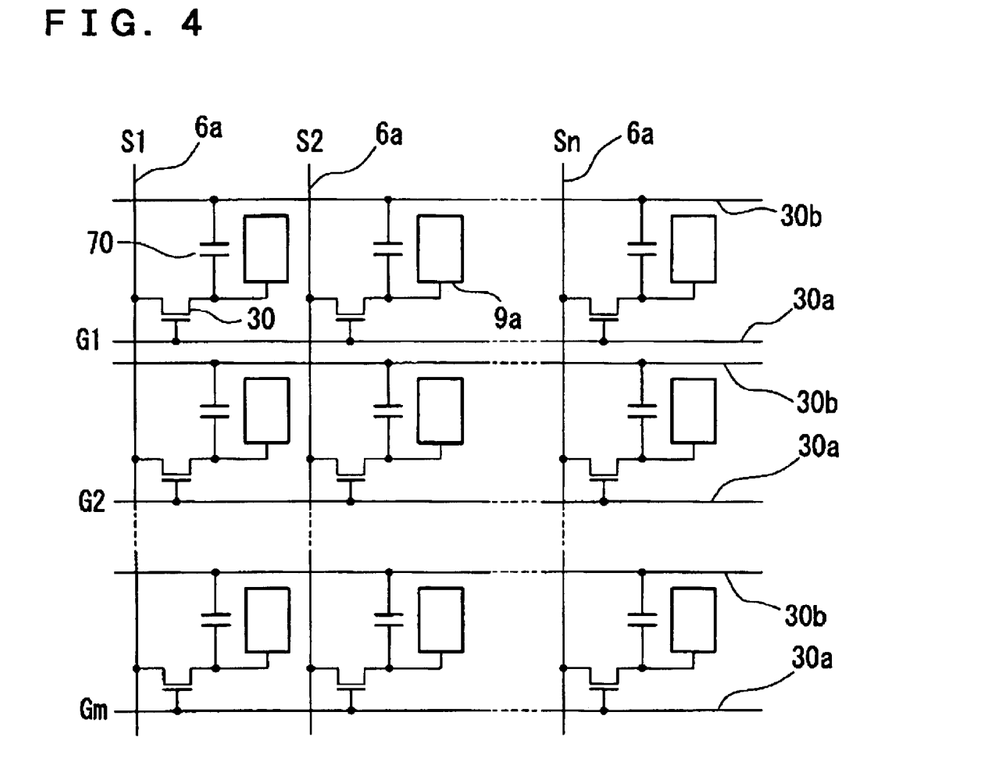
FIG. 4 is a diagram showing an equivalent circuit of a liquid crystal apparatus, which is an example of an electro-optical apparatus according to the present invention.
Figure 5:
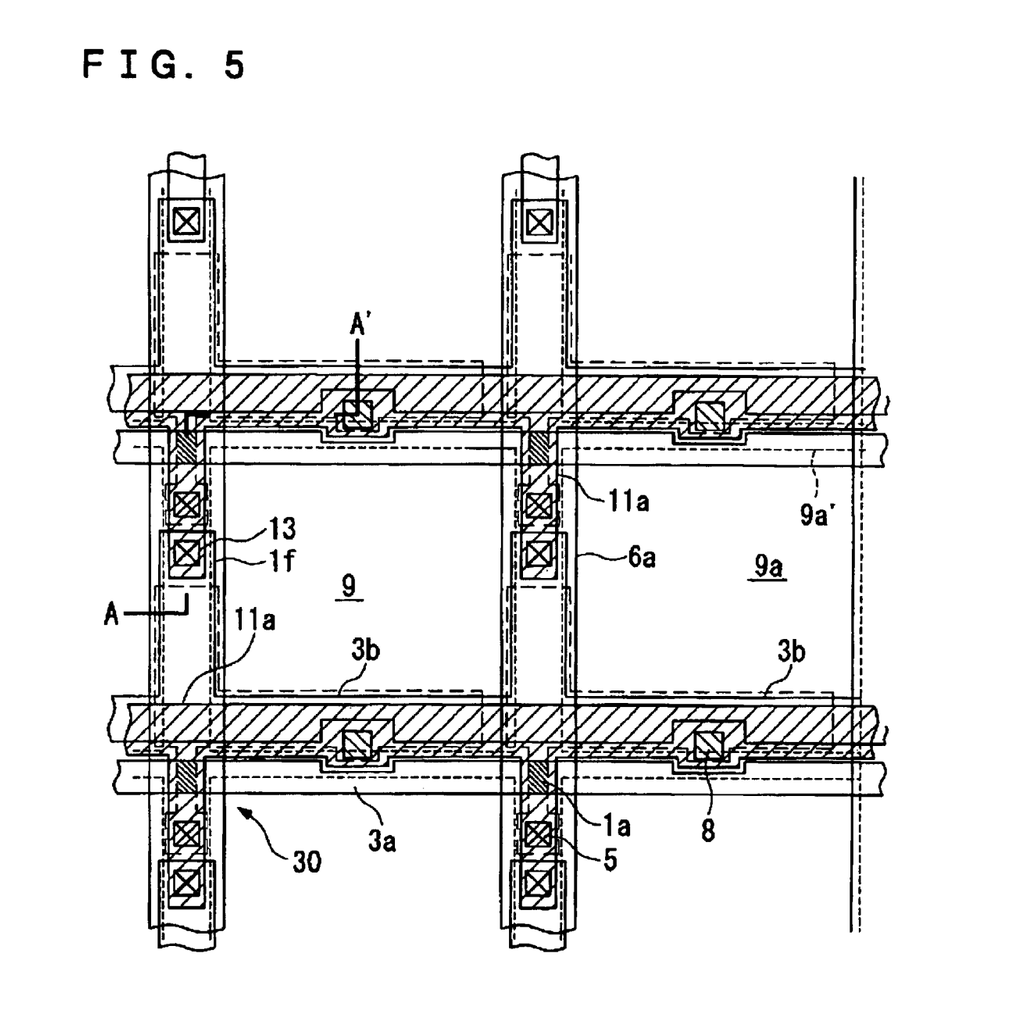
FIG. 5 is a plan view showing a plurality of pixels, adjacent to each other, arranged on a TFT array substrate included in the liquid crystal apparatus shown in FIG. 4.

FIG. 4 is a diagram showing an equivalent circuit including various elements and wiring lines connected to a plurality of pixels arranged in matrix in an image-forming region (pixel section or display region) of a liquid crystal apparatus, which is one of electro-optical apparatuses. FIG. 5 is a plan view showing a plurality of the pixels, adjacent to each other, arranged on a TFT array substrate in an enlarged manner. The TFT array substrate has data lines, scanning lines, pixel electrodes, a light-shielding layer, and the like thereon.

Figure 6:
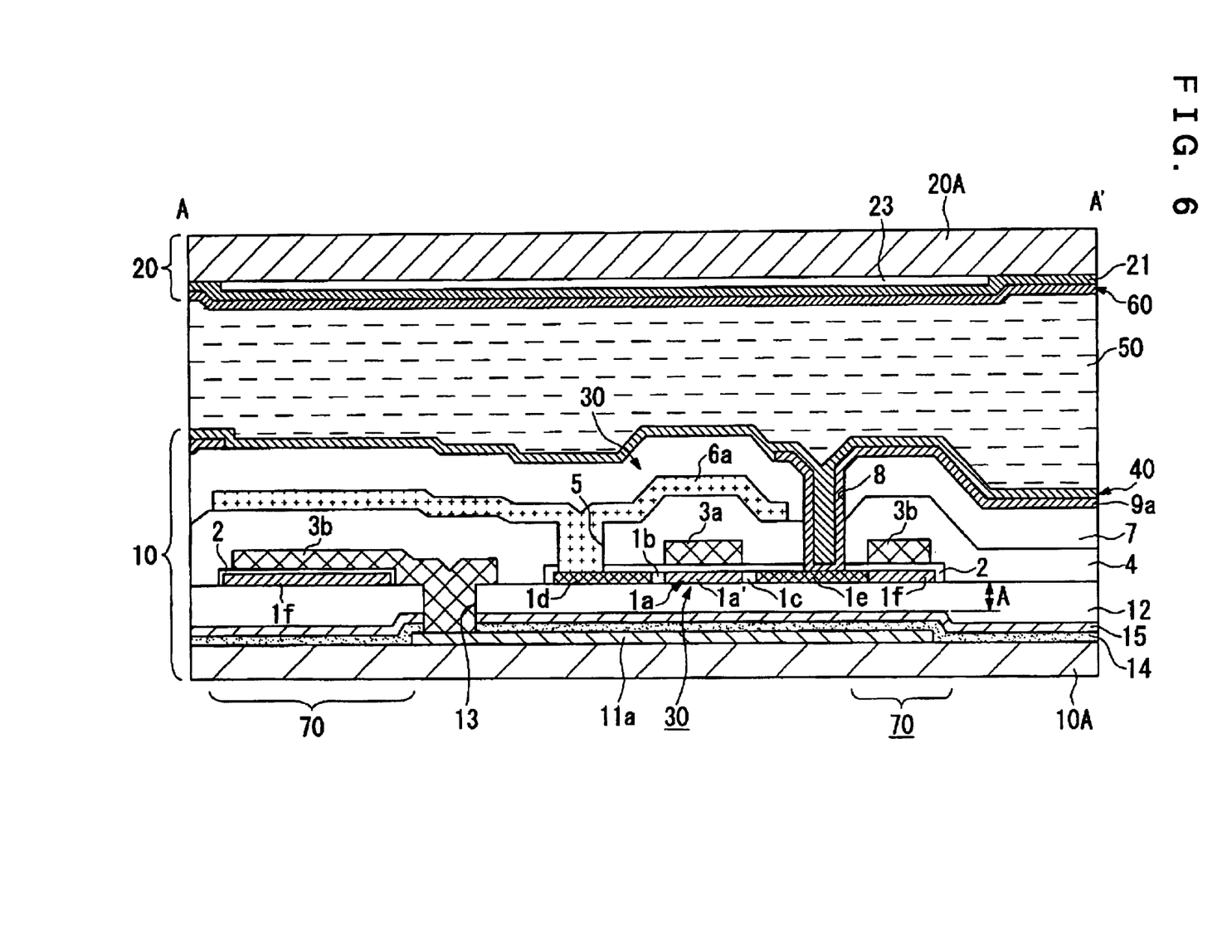
FIG. 6 is a sectional view taken along the line A–A' of FIG. 5.

FIG. 6 is a sectional view taken along the line A–A' of FIG. 5. In FIG. 6, in order to show layers and members on a recognizable scale, different scales are used for showing the layers and members.

With reference to FIG. 4, a plurality of the pixels are arranged in matrix in the image-forming region (pixel section or display region) of the liquid crystal apparatus of this embodiment. The pixels each include corresponding pixel electrodes 9a arranged in matrix and TFTs (transistor elements) 30 for controlling the pixel electrodes 9a. Data lines 6a to which image signals S1, S2, . . . , and Sn are transmitted are each electrically connected to corresponding sources of the TFTs 30. The image signals S1, S2, . . . , and Sn recorded in the data lines 6a may be line-sequentially transmitted to the data lines 6a in that order or may be transmitted to each group of the data lines 6a adjacent to each other. Scanning lines 3a are each electrically connected to corresponding gates of the TFTs 30, and scanning signals G1, G2, . . . , and Gm are line-sequentially applied to the scanning lines 3a in that order with predetermined timing in an intermittent mode. The pixel electrodes 9a are each electrically connected to corresponding drains of the TFTs 30, and the image signals S1, S2, . . . , and Sn transmitted from the data lines 6a are recorded in liquid crystals with predetermined timing by turning on the TFTs 30, functioning as switching elements, for a predetermined period.

The image signals S1, S2, . . . , and Sn, transmitted through the pixel electrodes 9a and then recorded in the liquid crystals, having a predetermined voltage level are stored between the pixel electrodes 9a and a counter electrode 21 (see FIG. 6) disposed on a counter substrate 20 (see FIG. 6) for a predetermined period. When the alignment or order of the liquid crystals is changed depending on the level of applied voltages, the liquid crystals modulate light, thereby displaying shades of gray. In a normally white mode, incident light is prevented from being transmitted through areas containing the liquid crystals depending on the level of applied voltages. In a normally black mode, incident light is allowed to be transmitted through the areas containing the liquid crystals depending on the level of applied voltages. Thereby, the liquid crystal apparatus displays an image having contrast depending on the image signals S1, S2, . . . , and Sn. In order to prevent the stored image signals S1, S2, . . . , and Sn from leaking, storage capacitors 70 are each placed in parallel to corresponding liquid crystal capacitors disposed between the pixel electrodes 9a and the counter electrode. Thereby, voltages applied to the pixel electrodes 9a are stored in the storage capacitors 70 for a period, for example, three orders of magnitude longer than a period for which voltages are applied to the data lines 6a.

Thus, signal-storing properties are enhanced, thereby obtaining liquid crystal apparatuses having high contrast ratio. In particular, in this embodiment, in order to form the storage capacitors 70, capacitor lines 3b are placed in the same level as that in which the scanning lines 3a are placed, as described below. The capacitor lines 3b formed using a conductive light-shielding film have low resistance.

The planar structure of the pixel section (image display region) on the TFT array substrate will now be described in detail with reference to FIG. 5. With reference to FIG. 5, a plurality of the transparent pixel electrodes 9a (the outline thereof is indicated by dotted line 9a') are arranged in matrix in the pixel section on the TFT array substrate of the liquid crystal apparatus. The data lines 6a, scanning lines 3a, and capacitor lines 3b extend along boundaries between the pixel electrodes 9a in the vertical and horizontal directions. The data lines 6a are each electrically connected to corresponding source regions 1d, described below, each disposed in corresponding semiconductor layers 1a, which are single-crystal silicon layers, with corresponding first contact holes 5 disposed therebetween. The pixel electrodes 9a are each electrically connected to corresponding drain regions 1e, described below, each disposed in the corresponding semiconductor layers 1a with second contact holes 8 disposed therebetween. The scanning lines 3a are arranged to face channel regions 1a' (regions indicated by diagonal lines extending upward in the right direction in FIG. 6) each disposed in the corresponding semiconductor layers 1a. The scanning lines 3a each function as a gate electrode.

Each capacitor line 3b has a main portion (that is, a first region extending along each scanning line 3a when viewed from above) extending substantially straight along each scanning line 3a and protrusive portions (that is, second regions each extending along the corresponding data lines 6a when viewed from above) that each extend along the corresponding data lines 6a and each protrude from corresponding intersections of the scanning lines 3a and data lines 6a toward an upper row of the pixels (in the upper direction of the figure).

A plurality of first light-shielding films 11a corresponding to the light-shielding layer 211 shown in FIG. 1 are arranged in the diagonally (upward in the right direction) shaded areas in the figure. In particular, the first light-shielding films 11a are arranged in the pixel section to cover the TFTs 30 including the channel regions 1a' of the semiconductor layers 1a when viewed from the TFT array substrate. Each first light-shielding film 11a has a main portion that extends straight along each scanning line 3a in the direction opposite to the direction the main portion of the scanning line 3a extends and has protrusive portions that each extend along the corresponding data lines 6a and each protrude from corresponding intersections of the first light-shielding films 11a and data lines 6a toward a row of the pixels (in the lower direction of the figure). In each row of the pixels, the top part of the protrusive portion of each first light-shielding films 11a extending downward and the top part of the protrusive portion of each capacitor line 3b extending upward overlap each other, the capacitor line 3b being disposed below the first light-shielding film 11a. Third contact holes 13 for each electrically connecting the corresponding first light-shielding films 11a and capacitor lines 3b each other are each placed in corresponding areas where the top parts overlap each other. That is, in this embodiment, the first light-shielding film 11a is electrically connected to the capacitor line 3b, disposed above or below the first light-shielding film 11a, with each third contact hole 13.

In this embodiment, the pixel electrodes 9a and TFTs 30 are placed only in the pixel section. However, the first light-shielding films 11a may be placed in the pixel section and also two-dimensionally arranged in regions outside the pixel section (peripheral regions of the pixel section) in the same pattern as that formed in the pixel. Such regions need not be shielded from light and include a sealing region on which a sealing member for bonding a counter substrate is placed, terminal pad regions on which external circuit connection terminals for connecting input and output signal lines are placed, and the like. Thus, the insulating layer 212 disposed above the first light-shielding films 11a can be uniformly planarized by a polishing process because the pixel section and the regions outside the pixel section have substantially the same irregularities. Thereby, the insulating layer 212 can be securely bonded to the single-crystal silicon precursor layer 226.

The cross sectional structure of the pixel section of the liquid crystal apparatus will now be described with reference to FIG. 6. With reference to FIG. 6, the liquid crystal apparatus includes a TFT array substrate 10, which is one of light-transmitting substrates, and a transparent counter substrate 20 facing the TFT array substrate 10. The TFT array substrate 10 includes a quartz plate 10A and the counter substrate 20 includes a glass plate 20A (a quartz plate is acceptable). The quartz plate 10A further includes the pixel electrodes 9a and a first alignment layer 40 disposed thereon. The first alignment layer 40 has been subjected to predetermined treatment, for example, rubbing. Each pixel electrode 9a comprises a transparent, conductive thin-film such as an indium tin oxide (ITO) thin-film. The first alignment layer 40 can include an organic thin-film, such as a polyimide thin-film.

On the other hand, the counter substrate 20 includes a second light-shielding film 23 disposed above regions of the TFT array substrate 10 in which the data lines 6a, scanning lines 3a, and TFTs 30 for switching the pixels are arranged. That is, the second light-shielding film 23 is placed in an area other than openings of the pixels. The counter substrate 20 including the second light-shielding film 23 has a counter electrode (common electrode) 21 disposed thereover. The counter electrode 21, as well as the pixel electrodes 9a of the TFT array substrate 10, can include a transparent, conductive thin-film, such as an ITO thin-film. The second light-shielding film 23 prevents incident light, transmitted through the counter substrate 20, from entering the channel regions 1a', lightly doped source regions 1b, and lightly doped drain regions 1c of the semiconductor layers 1a of the TFTs 30 for switching the pixels. When the second light-shielding film 23 is placed in a display unit including a color filter, the second light-shielding film 23 functions as a black matrix film that enhances the contrast ratio and prevents color mixing, due to coloring materials, from occurring. A second alignment layer 60 is disposed over the counter electrode 21. The second alignment layer 60 may have an organic film, such as a polyimide film or an inorganic film, formed by the oblique deposition of silicon dioxide.

The TFT array substrate 10 and counter substrate 20 that have the above configurations are arranged such that the pixel electrodes 9a face the counter electrode 21. A space disposed between the TFT array substrate 10 and counter substrate 20 is surrounded by a sealing member (not shown) and filled with liquid crystals in a sealed manner, thereby forming a liquid crystal layer 50. In the liquid crystal layer 50, predetermined orientation is maintained due to the first and second alignment layers 40 and 60 while an electric field is not applied to the liquid crystal layer 50 from the pixel electrodes 9a. The liquid crystal layer 50 contains one or more species of nematic liquid crystals. The sealing member is used for joining the edge of the TFT array substrate 10 to that of the counter substrate 20 and contains an adhesive such as a photocurable resin or thermosetting resin and spacers, such as glass fibers or glass beads, for providing a predetermined distance between the substrates.

With reference to FIG. 6, the first light-shielding films 11a face the TFTs 30 for switching the pixels and are each disposed below the corresponding TFTs 30 arranged in the TFT array substrate 10. The first light-shielding films 11a preferably contain single metal, alloy, metal silicide, or the like containing at least one selected from the group consisting of Ti, Cr, W, Ta, Mo, and Pb, which are opaque metals having a high melting point.

Since the first light-shielding films 11a contain such a material, the first light-shielding films 11a can be prevented from being damaged or melted in a step of forming the TFTs 30 at high temperature for switching the pixels, this step being performed after the first light-shielding films 11a are formed in the TFT array substrate 10. In this embodiment, the first light-shielding films 11a disposed in the TFT array substrate 10 prevent returning light, reflected by the TFT array substrate 10, from entering the channel regions 1a', lightly doped source regions 1b, and lightly doped drain regions 1c of the TFTs 30 for switching the pixels. Thus, the pixel-switching TFTs 30 functioning as transistor elements can be prevented from being deteriorated in property because photocurrent is not generated.

The following layers are placed between the first light-shielding films 11a and semiconductor layers 1a in common with the configuration shown in FIG. 1: an adhesion layer 14 containing silicon dioxide, a protective layer 15 containing silicon nitride or silicon oxide nitride, and a first interlayer insulating film (insulating layer) 12. The first interlayer insulating film 12 electrically insulates the semiconductor layers 1a, which are parts of the TFTs 30 for switching the pixels, from the first light-shielding films 11a. The first interlayer insulating film 12 is disposed over the TFT array substrate 10 and planarized by polishing the surface thereof, thereby removing steps due to the first light-shielding films 11a. In the electro-optical substrate 200, shown in FIG. 1, according to the present invention, the first interlayer insulating film 12 corresponds to the insulating layer 212, and the semiconductor layers 1a included in the TFTs 30 correspond to the single-crystal silicon layers 206 (semiconductor layer). The TFT array substrate 10 of the liquid crystal apparatus according to this embodiment is manufactured by the same method as that for manufacturing the electro-optical substrate 200 shown in FIG. 1.

A method for manufacturing the liquid crystal apparatus of this embodiment includes at least the following steps: a step of preparing a base plate including the semiconductor layers 1a according to the procedures shown in FIGS. 2 and 3; a step of forming the channel regions 1a', the lightly doped source regions 1b, the lightly doped drain regions 1c, heavily doped source region 1d, heavily doped drain regions 1e, and first storage capacitor lines 1f in the semiconductor layers 1a of the obtained base plate, forming the scanning lines 3a, the capacitor lines 3b, the data lines 6a, the pixel electrodes 9a, a second interlayer insulating film 4, a third interlayer insulating film 7, and second contact holes 8 above the semiconductor layers 1a by the same process as known processes (for example, a photolithographic process), and then forming a first alignment layer 40 on the pixel electrodes 9a to prepare the TFT array substrate 10. The manufacturing method can further include a step of forming a second light-shielding film 23, counter electrode 21, second alignment layer 60 on another base plate according to the same procedure as the above to prepare the counter substrate 20. The TFT array substrate 10 and counter substrate 20 including the above components are arranged such that the alignment direction of the first alignment layer 40 and that of the second alignment layer 60 cross each other to form an angle of, for example, 90° and then joined to each other with the sealing member (not shown) disposed therebetween such that the cell thickness is 4 μm, thereby obtaining an empty panel. Liquid crystals such as TN liquid crystals are packed into the panel in a sealed manner, thereby obtaining the liquid crystal apparatus of this evaporation method.

In this embodiment, the first interlayer insulating film 12 may contain, for example, high insulating glass such as nondoped silicate glass (NSG), phosphorus silicate glass (PSG), boron silicate glass (BSG), or boro-phospho-silicate glass (BPSG); silicon nitride; or the like other than the material described in the above-mentioned method for manufacturing the electro-optical apparatus. The first interlayer insulating film 12 prevents ingredients of the first light-shielding films 11a from contaminating the pixel-switching TFTs 30 and the like. In the liquid crystal apparatus of this embodiment, the ingredients of the first light-shielding films 11a can be securely prevented from being diffused in other portions because the first interlayer insulating film 12 can be prevented from being reduced in thickness by etching.

In the liquid crystal apparatus of this embodiment, in the display region, the thickness A of the first interlayer insulating film 12, which is disposed between the first light-shielding films 11a and semiconductor layers 1a, is 0.4 μm or more. In the liquid crystal apparatus having the display region for displaying an image and non-display regions placed beside the display region, in order to drive circuits (for example, a data line-driving circuit 101 and scanning line-driving circuits 104 shown in FIG. 7) placed in the non-display regions, a voltage of about 12 V must be applied to the circuits. Therefore, the semiconductor layers 1a placed in the non-display regions must have a thickness of 0.2 μm or more. However, when the semiconductor layers 1a are placed in the non-display regions, the thickness of the semiconductor layers 1a placed in the display region is 0.07 μm or less on a design basis.

When the semiconductor layers 1a of the display region and the semiconductor layers 1a of the non-display region are formed in the same step, the semiconductor layers 1a must have a thickness of 0.2 μm or more. In order to reduce the thickness of the semiconductor layers 1a of the display region from 0.2 μm or more to about 0.07 μm, 0.13 μm or more of the semiconductor layers 1a must be removed.

When the sacrificial oxide layer 226a (see FIG. 3) described above is formed and then removed in order to reduce the thickness, the sacrificial oxide layer 226a (see FIG. 3) must have a thickness of about 0.3 μm in consideration of the volume expansion due to oxidation. Thus, the first interlayer insulating film 12 disposed below the semiconductor layers 1a must have a thickness larger than that of the sacrificial oxide layer 226a, for example, a thickness of at least 0.4 μm. That is, when the first interlayer insulating film 12 has a thickness of about 0.4 μm, the following problem can be prevented from occurring: the first interlayer insulating film 12 is etched and therefore the first light-shielding films 11a and the like disposed below the first interlayer insulating film 12 are peeled off in manufacturing steps. Thus, the liquid crystal apparatus having high reliability can be obtained.

In this embodiment, portions of gate insulating layers 2 each extending under the corresponding scanning lines 3a function as dielectric films, end portions of the semiconductor layers 1a function as first storage capacitor electrodes 1f, and portions of the capacitor lines 3b disposed on the gate insulating layers 2 function as second storage capacitor electrodes. Each dielectric film, first storage capacitor electrode 1f, and second storage capacitor electrode form a storage capacitor 70. In particular, the heavily doped drain regions 1e of the semiconductor layers 1a each extend below the corresponding data lines 6a and scanning lines 3a. The heavily doped drain regions 1e are each disposed below the corresponding capacitor lines 3b, extending along the data lines 6a and scanning lines 3a, with the corresponding gate insulating layers 2 disposed therebetween. The end portions of the semiconductor layers 1a disposed below the capacitor lines 3b function as the first storage capacitor electrodes (semiconductor layers) 1f. Since the gate insulating layers 2 functioning as the dielectric films of the storage capacitors 70 are components of the TFTs 30 formed on single-crystal silicon layers by high-temperature oxidation, the gate insulating layers 2 have a small thickness and a large dielectric strength. Hence the storage capacitors 70 have a large capacitance and a relatively small area.

With reference to FIGS. 5 and 6, the first light-shielding films 11a are each disposed below the corresponding first storage capacitor electrodes 1f, which are each disposed below the corresponding capacitor lines 3b functioning as the second storage capacitor electrodes, with the first interlayer insulating film 12 disposed therebetween (see the storage capacitors 70 shown in the right region of FIG. 6). The first light-shielding films 11a function as third storage capacitor electrodes. Thus, the storage capacitors 70 have an increased capacitance. That is, in this embodiment, stacked storage capacitor structures in which the first storage capacitor electrodes 1f are each placed between storage capacitors are used, thereby obtaining high capacitance. Thus, the liquid crystal apparatus securely prevents a flicker from occurring in a displayed image and prevents image sticking from occurring.

According to the above configuration, the storage capacitance of the pixel electrodes 9a can be increased by making full use of areas disposed below the data lines 6a and areas in which the disclination of the liquid crystals occurs along the scanning lines 3a (that is, areas in which the capacitor lines 3b are arranged), these areas being outside the openings of the pixels.

In this embodiment, the first light-shielding films 11a (and the capacitor lines 3b electrically connected thereto) are electrically connected to a constant voltage power source. Hence the first light-shielding films 11a and capacitor lines 3b have constant potential. Thus, fluctuations in voltage of the first light-shielding films 11a do not adversely affect the pixel-switching TFTs 30 disposed above the first light-shielding films 11a. The capacitor lines 3b can well function as the second storage capacitor electrodes of the storage capacitors 70. In this configuration, the constant voltage power source includes a negative or positive power source connected to peripheral circuits for driving the liquid crystal apparatus(for example, a scanning line-driving circuit, a data line-driving circuit, and the like), a grounding power source, a constant voltage power source connected to the counter electrode 21, and the like. The first light-shielding films 11a and capacitor lines 3b are allowed to have constant voltage by the use of such a power source of the peripheral circuits without dedicated arranging electric wiring lines and external input terminals.

With reference to FIGS. 5 and 6, in this embodiment, the TFT array substrate 10 includes the first light-shielding films 11a, which are each electrically connected to the corresponding capacitor lines 3b, disposed above and below the first light-shielding films 11a, through the corresponding third contact holes 13. In this configuration, the number of steps between the following regions are smaller as compared to a configuration in which the first light-shielding films 11a are electrically connected to capacitor lines disposed in the same level as that in which the first light-shielding films 11a are placed: regions including the first light-shielding films 11a, capacitor lines 3b, and data lines 6a, disposed in that order, extending along the edges of the pixel openings and other regions. Since the number of the steps lying along edges of the pixel openings is small, disclination (misorientation) due to the steps can be prevented from occurring in the liquid crystals. Thus, the area of the pixel openings can be expanded.

The first light-shielding films 11a have the protrusive portions extending from each main portion extending straight, and the third contact holes 13 are placed on the protrusive portions, as described above. It is known that cracks hardly occur when the third contact holes 13 are formed in areas close to the edges of the protrusive portions, because stresses are released from the edges. Thus, stresses applied to the first light-shielding films 11a during the manufacturing steps can be reduced by forming the third contact holes 13 as closely to the edges of the protrusive portions as possible (preferably, closely to the top ends of the protrusive portions). Thereby, cracks can be securely prevented from occurring and yield can be increased.

The capacitor lines 3b and scanning lines 3a are formed using a single polysilicon layer, the gate insulating layers 2 of the TFT 30 and the dielectric films of the storage capacitors 70 are formed using a single high temperature oxide layer. Furthermore, the first storage capacitor electrodes 1f and the channel regions 1a', source regions 1d, and drain regions 1e of the TFTs 30 are disposed in the semiconductor layers 1a. Thus, layered structure on the TFT array substrate 10 can be simplified. Furthermore, in a method for manufacturing a liquid crystal apparatus described below, the capacitor lines 3b and scanning lines 3a can be formed in a single step of forming a thin-film, and the gate insulating layers 2 and the dielectric films of the storage capacitors 70 can be formed in one step.

With reference to FIG. 5, the first light-shielding films 11a each extend along the corresponding scanning lines 3a and are separately arranged, in a striped pattern, in the direction that the data lines 6a extend. In the layered structure of the liquid crystal apparatus including polysilicon films for forming the first light-shielding films 11a, scanning lines 3a, and capacitor lines 3b, metal films for forming the data lines 6a, interlayer insulating films, and the like, stresses that are due to a difference in property of the films and generated by heating and cooling operations during the manufacturing steps can be more readily reduced as compared to a structure including a single light-shielding film having openings, arranged in a grid pattern, corresponding to the pixel openings. Thus, cracks can be securely prevented from occurring in the first light-shielding films 11a and the like, and yield can be increased.

With reference to FIG. 5, the main portions of the first light-shielding films 11a extending straight and the main portions of the capacitor lines 3b extending straight overlap each other. If the first light-shielding films 11a are each arranged to cover the corresponding lower faces of the channel regions 1a' of the TFTs 30 and the first light-shielding films 11a and capacitor lines 3b overlap each other at some portions such that the third contact holes 13 can be formed, the corresponding TFTs 30 can be shielded from light and the resistance of the capacitor lines 3b can be reduced. Thus, each first light-shielding film 11a may be placed in a narrow space, disposed between each scanning line 3a and capacitor line 3b adjacent to each other, extending along the scanning line 3a and may extend to a position below the scanning line 3a.

The capacitor lines 3b are each electrically connected to the corresponding first light-shielding films 11a securely with high reliability through the third contact holes 13 arranged in the first interlayer insulating film 12. The pixels may each have the corresponding third contact holes 13, and a group of the pixels may have each third contact hole 13.

When the pixels each have the corresponding third contact holes 13, the capacitor lines 3b can be readily reduced in resistance using the first light-shielding films 11a, thereby increasing the degree of redundancy therebetween. On the other hand, when a group of the pixels (for example, a group of two or three of the pixels) have each third contact hole 13, a great merit can be obtained in practical use because the following advantages and disadvantages can be balanced in consideration of the sheet resistance, driving frequency, and necessary performance of the capacitor lines 3b and first light-shielding films 11a: advantages due to the redundancy and an decrease in resistance of the capacitor lines 3b due to the first light-shielding films 11a and disadvantages such as defects in the liquid crystal apparatus, complicated manufacturing steps that are necessary to form a large number of the third contact holes 13, and the like.

Each third contact hole 13 that belongs to each pixel or a group of the pixels extends below the data lines 6a when viewed from the counter substrate 20. That is, the third contact holes 13 are located out of the openings of the pixels and are placed in areas of the first interlayer insulating film 12 where the TFT 30 and first storage capacitor electrodes if are not arranged. Thus, defects due to the formation of the third contact holes 13 can be prevented from occurring in the TFTs 30 and other wiring lines while the pixels are efficiently used.

With reference to FIG. 6, the TFTs 30 for switching the pixels have lightly doped drain (LDD) structure and each include the corresponding scanning lines 3a, channel regions 1a', gate insulating layers 2, data lines 6a, lightly doped source regions (source-side LDD regions) 1b, lightly doped drain regions (drain-side LDD regions) 1c, heavily doped source regions 1d, and heavily doped drain regions 1e. The channel regions 1a', lightly doped source regions 1b, lightly doped drain regions 1c, heavily doped source regions 1d, and heavily doped drain regions 1e are disposed in the semiconductor layers 1a. Channels are formed in the channel regions 1a' by applying electric fields from the scanning lines 3a. The gate insulating layers 2 insulate the scanning line 3a from the semiconductor layers 1a. The heavily doped drain regions 1e are each connected to the corresponding pixel electrodes 9a.

The lightly doped source regions 1b, heavily doped source regions 1d, lightly doped drain regions 1c, and heavily doped drain regions 1e are formed by doping regions of the semiconductor layers 1a with a n-type or p-type dopant at a predetermined dose depending on whether n-type channels or p-type channels are formed. TFTs with such n-type channels have high operating speed and are therefore fit for the TFTs 30 for switching the pixels.

The data lines 6a each can include a light-shielding thin-film, such as a metal film containing Al or the like or an alloy film containing metal silicide or the like. The second interlayer insulating film 4 is disposed on the scanning lines 3a, gate insulating layers 2, and first interlayer insulating film 12 and has the first contact holes 5 each extending to the corresponding source regions 1d and the second contact holes 8 each extending to the corresponding heavily doped drain regions 1e. The data lines 6a are each electrically connected to the corresponding heavily doped source regions 1d through the corresponding first contact holes 5 each extending to the corresponding lightly doped source regions 1b.

The third interlayer insulating film 7 has the second contact holes 8 extending to the heavily doped drain regions 1e and is disposed on the data lines 6a and second interlayer insulating film 4. The pixel electrodes 9a are each electrically connected to the corresponding heavily doped drain regions 1e through the second contact holes 8 extending to the heavily doped drain regions 1e. The pixel electrodes 9a are arranged on the third interlayer insulating film 7 having the above configuration. The pixel electrodes 9a may be electrically connected to the heavily doped drain regions 1e with Al films similar to the data lines 6a or polysilicon films similar to the capacitor lines 3b.

The TFTs 30 for switching the pixels preferably have the LDD structure as described above and may have off-set structure obtained without implanting impurity ions into the lightly doped source regions 1b and lightly doped drain regions 1c or self-aligned structure obtained by implanting impurity ions into the regions at high dose using the scanning lines 3a as masks to form heavily doped source regions and drain regions in a self-aligned manner.

The TFTs 30 for switching the pixels have single gate structure in which each gate electrode (scanning line 3a) is placed between each heavily doped source region 1d and heavily doped drain region 1e. However, the TFTs 30 may have double or more gate structure having two or more of the gate electrodes placed between these regions. In such structure, the same signals must be applied to each gate electrode. When the TFTs 30 have the double gate structure or triple or more gate structure described above, currents can be prevented from leaking from junctions of channel regions and source or drain regions, whereby currents consumed during downtime can be reduced. When at least one of the gate electrodes has the LDD structure or off-set structure, currents consumed during downtime can be further reduced, thereby obtaining stable switching elements.

When light enters the channel regions 1a', lightly doped source regions 1b, and lightly doped drain regions 1c of the semiconductor layers 1a containing single-crystal silicon, photocurrents are generated in the regions by the photoelectric conversion effect of silicon in general, whereby the pixel-switching TFTs 30 are deteriorated in transistor property. However, in this embodiment, since the data lines 6a each can include a light-shielding thin-film containing metal such as Al are disposed over the scanning lines 3a, light can be securely prevented from entering at least the channel regions 1a', lightly doped source regions 1b, and lightly doped drain regions 1c. Furthermore, since the first light-shielding films 11a are arranged below the pixel-switching TFTs 30, returning light can be securely prevented from entering at least the channel regions 1a', lightly doped source regions 1b, and lightly doped drain regions 1c.

In this embodiment, each capacitor line 3b connected to the pixels arranged in one of rows adjacent to each other is connected to each first light-shielding film 11a connected to the pixels arranged in another row. Therefore, one of the capacitor lines 3b must supply the first light-shielding film 11a, connected to the pixels arranged in the top or bottom row, with a constant voltage. Thus, the number of the capacitor lines 3b is preferably one larger than that of the pixels arranged in the vertical direction.

Figure 7:
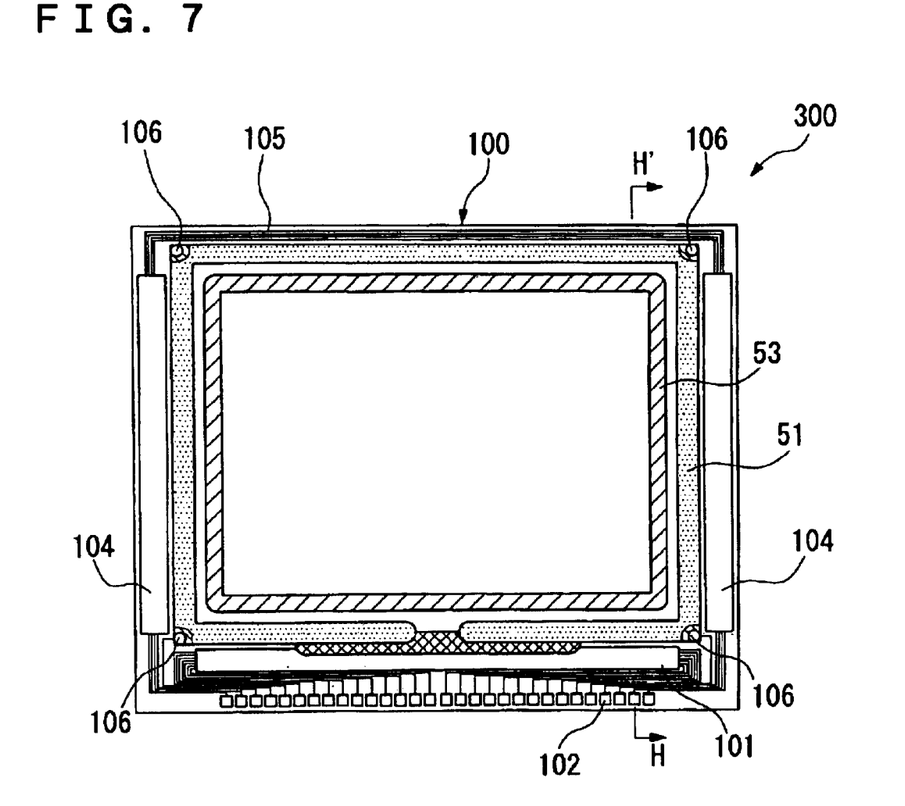
FIG. 7 is a plan view showing the TFT array substrate, having components thereon, included in the liquid crystal apparatus according to an embodiment.
Figure 8:
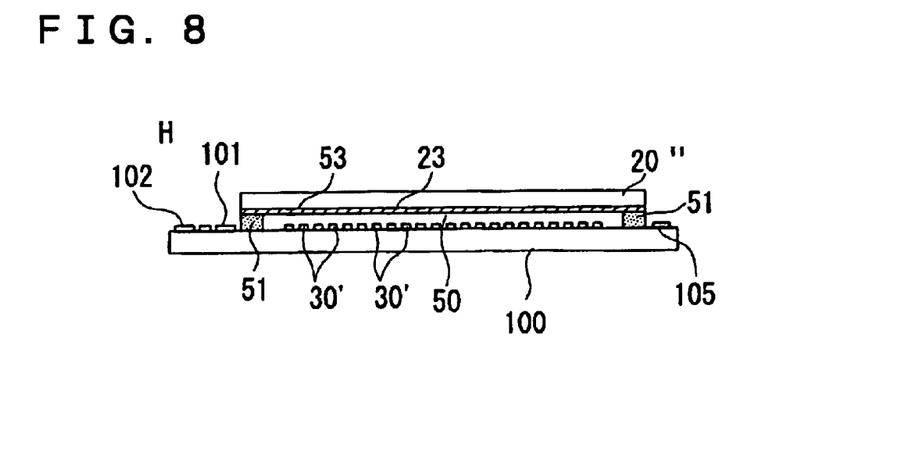
FIG. 8 is a sectional view showing taken along the line H–H' of FIG. 7.

The entire configuration of the liquid crystal apparatus including the above components will now be described with reference to FIGS. 7 and 8. FIG. 7 is a plan view showing the TFT array substrate 10 having the components thereon when viewed from the counter substrate 20. FIG. 8 is a sectional view showing the TFT array substrate 10 including the counter substrate 20 taken along the line H–H' of FIG. 7.

With reference to FIG. 7, the TFT array substrate 10 has a sealing member 51 thereon extending along the edge thereof A third light-shielding film 53 is placed in an area surrounded by the sealing member 51 and extends along the sealing member 51. The third light-shielding film 53 functioning as a partition contains a material that is the same as or different from that contained in the second light-shielding film 23. In areas outside the sealing member 51, data line-driving circuits 101 and external circuit-connecting terminals 102 are arranged along a side of the TFT array substrate 10, and scanning line-driving circuits 104 are each arranged along corresponding sides adjacent to the above side.

If a delay in transmitting some scanning signals to the scanning lines 3a does not cause any problem, the scanning line-driving circuits 104 may be placed on one side. The data line-driving circuits 101 may be placed on both sides of an image display region. For example, such image signals may be transmitted to each data line 6a having an odd ordinal through one of the data line-driving circuits 101 placed on one of the sides of an image display region, and the image signals may be transmitted to each data line 6a having an even ordinal through the other placed on the other side. When the data lines 6a are interdigitally driven as described above, areas occupied by the data line-driving circuits 101 can be increased, thereby forming complicated substrates.

A plurality of wiring lines 105 for connecting the scanning line-driving circuits 104, each other, each disposed on both sides of the image display region are disposed on the other side of the TFT array substrate 10. A precharge circuit may be placed below the third light-shielding film 53 serving as a partition. A conductive member 106 for electrically connecting the TFT array substrate 10 to the counter substrate 20 is placed in at least one of corners of the counter substrate 20. With reference to FIG. 8, the counter substrate 20 having substantially the same outline as that of the sealing member 51 shown in FIG. 7 is joined to the TFT array substrate 10 in a fixed manner with the sealing member 51 disposed therebetween.

The TFT array substrate 10 of the liquid crystal apparatus including the above components may have an inspection circuit, disposed on it, for inspecting the liquid crystal apparatus for quality and defects in manufacturing steps and/or at the time of delivery. The data line-driving circuits 101 and scanning line-driving circuits 104 need not be placed on the TFT array substrate 10, but may be electrically or mechanically connected to, for example, a driving LSI mounted on a tape automated bonding (TAB) substrate through anisotropic conductive films placed on end regions of the TFT array substrate 10. Polarizing films, retardation films, polarizers, or the like are placed on a face of the counter substrate 20 on which projected light is incident and a face of the TFT array substrate 10 from which outgoing light is emitted such that the films and polarizers are arranged in predetermined directions depending on an operating mode, such as a twisted nematic (TN) mode, super twisted nematic (STN) mode, or dual scan STN (D-STN) mode and a display mode, such as a normally white mode or normally black mode.

In this embodiment, the liquid crystal apparatus including the liquid crystals, which are electro-optical materials, is described as an example of the electro-optical apparatus. The liquid crystals include known various liquid crystals, for example, bistable liquid crystals such as twisted nematic (TN) liquid crystals, super twisted nematic (STN) liquid crystals twisted by an angle of 180° or more, bistable twisted nematic (BTN) liquid crystals, and ferroelectric liquid crystals having a memory function; polymer-dispersed liquid crystals; guest host liquid crystals.

The present invention is applicable to various electro-optical apparatuses including electroluminescent (EL) devices, digital micro-mirror devices (DMD), or devices for emitting fluorescent light due to plasma emission or electron emission, in addition to liquid crystal apparatuses including electro-optical materials.

It should be understood that the present invention is not limited to the above embodiments, and various modifications may be performed within the scope and spirit of the present invention specified in the specification and claims. The present invention is intended to cover a modified method for manufacturing an electro-optical substrate, a modified method for manufacturing an electro-optical apparatus, and a modified electro-optical apparatus.

Additionally, while this invention has been described in conjunction with specific embodiments thereof, it is evident that many alternatives, modifications, and variations will be apparent to those skilled in the art. Accordingly, preferred embodiments of the invention as set forth herein are intended to be illustrative, not limiting. Various changes may be made without departing from the spirit and scope of the invention.

What is claimed is:

1. A method for manufacturing an electro-optical substrate including a composite base plate obtained by joining a support plate to a semiconductor plate having semiconductor layers, comprising:

forming a light-shielding layer, having a predetermined pattern, on a support plate;

forming an insulating layer on the light-shielding layer having the predetermined pattern;

providing semiconductor layers on the insulating layer;

partially oxidizing the semiconductor layer to form an oxide layer; and completely removing the oxide layer, the oxid layer having a thickness smaller than that of the insulating layer.

2. The method for manufacturing an electro-optical substrate according to claim 1, further comprising:

patterning the semiconductor layer; and oxidizing parts of the semiconductor layers having a predetermined pattern to form the oxide layer, the patterning step and oxidizing step being performed after the semiconductor layer-providing step.

3. The method for manufacturing an electro-optical substrate according to claim 1, the oxide layers having a thickness smaller than that of parts of the insulating layer disposed in areas above which the semiconductor layer is not placed, and which are disposed on the light-shielding layer.

4. The method for manufacturing an electro-optical substrate according to claim 1, further comprising:

forming a silicon nitride layer or silicon oxide nitride layer between the light-shielding layer and the insulating layer.

5. The method for manufacturing an electro-optical substrate according to claim 1, the semiconductor layer-providing step including a sub-step of joining a single-crystal semiconductor plate including the semiconductor layers to a support plate including the insulating layer.

6. The method for manufacturing an electro-optical substrate according to claim 1, the light-shielding layer containing a high-melting metal or a silicide containing a high-melting metal.

7. A method for manufacturing an electro-optical apparatus including a semiconductor element, comprising manufacturing an electro-optical substrate including the semiconductor element by the manufacturing method according to claim 1.

* * * * *